United States Patent [19]

Okamura

[11] Patent Number: 5,067,003
[45] Date of Patent: Nov. 19, 1991

[54] SEMICUSTOM-MADE SEMICONDUCTOR INTEGRATED CIRCUIT HAVING INTERFACE CIRCUIT SELECTIVELY COUPLED TO DIFFERENT VOLTAGE SOURCE

[75] Inventor: Hitoshi Okamura, Tokyo, Japan
[73] Assignee: NEC Corporation, Tokyo, Japan
[21] Appl. No.: 584,910
[22] Filed: Sep. 19, 1990

[30] Foreign Application Priority Data
Sep. 25, 1989 [JP] Japan .................. 1-248534

[51] Int. Cl.$^5$ .................. H01L 23/48; H01L 25/16
[52] U.S. Cl. .................. 357/68; 357/45; 307/446
[58] Field of Search .................. 357/45, 68, 71, 75; 307/303, 279, 467, 446, 456, 455, 528, 296.1

[56] References Cited
U.S. PATENT DOCUMENTS

| | | | |
|---|---|---|---|
| 4,760,289 | 7/1988 | Eichelberger et al. | 357/45 |
| 4,807,017 | 2/1989 | Ema et al. | 357/45 |
| 4,945,263 | 7/1990 | Estrada | 307/455 |
| 4,987,578 | 1/1991 | Akins et al. | 307/446 |

Primary Examiner—Rolf Hille
Assistant Examiner—S. V. Clark
Attorney, Agent, or Firm—Whitham & Marhoefer

[57] ABSTRACT

A semicustom-made semiconductor integrated circuit is fabricated on a single semiconductor chip, and comprises a first high level line, a first low level line, a first interface circuit coupled between the first high level line and the first low level line, a second high level line, a second low level line, a second interface circuit coupled between the second high level line and the second low level line, interconnections for alternatively coupling the first low level line to the second high level line and the first high and low level lines with the second high and low level lines, respectively, depending upon a user's request, and a dual power supply system or a single power supply system coupled to the first high and low level lines and said second high and low level lines, whereby the second interface circuit operates on either first or second voltage range.

15 Claims, 7 Drawing Sheets

SEMICUSTOM-MADE SEMICONDUCTOR INTEGRATED CIRCUIT HAVING INTERFACE CIRCUIT SELECTIVELY COUPLED TO DIFFERENT VOLTAGE SOURCE

FIELD OF THE INVENTION

This invention relates to a semicustom-made semiconductor integrated circuit and, more particularly, to interconnections selectively coupled between component interface circuits and sources of voltage level.

DESCRIPTION OF THE RELATED ART

A semicustom-made semiconductor integrated circuit such as an application specific integrated circuit (which is abbreviated as "ASIC") finds a wide variety of application and fabricates a complex electronic circuit on a single semiconductor chip instead of a plurality of small scale integrated circuits. The master-slice technology allows a manufacturer to complete semicustom-made semiconductor integrated circuits within a short time period. A semicustom-made semiconductor integrated circuit is usually implemented by some kinds of component transistor circuit, and interface circuits are provided therein for coupling different types of component transistor. If the semicustom-made semiconductor integrated circuit are implemented by more than two kinds of component transistor circuit, two or three types of interface circuits are necessary for the semicustom-made integrated circuit.

A transistor-transistor logic, an emitter-coupled logic and a complementary MOS inverter circuit are typical examples of component elements incorporated in the semicustom-made semiconductor integrated circuit. An interface circuit for the emitter-coupled logic (which is hereinbelow referred to as "ECL level interface circuit") operates between a negative voltage level, which usually ranges from −4.5 volts to −5.2 volts, and the ground voltage level, but an interface circuit for the transistor-transistor logic and/or the complementary MOS inverter circuit (which is referred to as "TTL level interface circuit") needs a voltage range between a positive, typically +5 volts, and the ground voltage level. In a case where the ECL level interface circuit and the TTL level interface circuit are incorporated in a semicustom-made semiconductor integrated circuit, the semicustom-made semiconductor integrated circuit should be equipped with not only a negative voltage source but also a positive voltage source. However, such a dual power supply system is inconvenient, and a quasi-ECL level interface circuit or an off-set ECL level interface circuit has been proposed.

Figure 1:
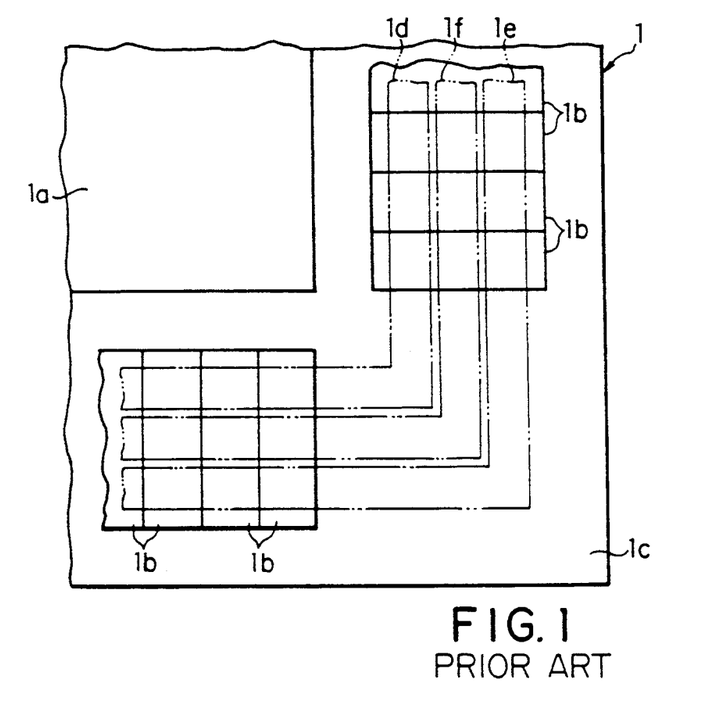
FIG. 1 is a plan view showing a part of a semicustom-made semiconductor integrated circuit.
Figure 2:
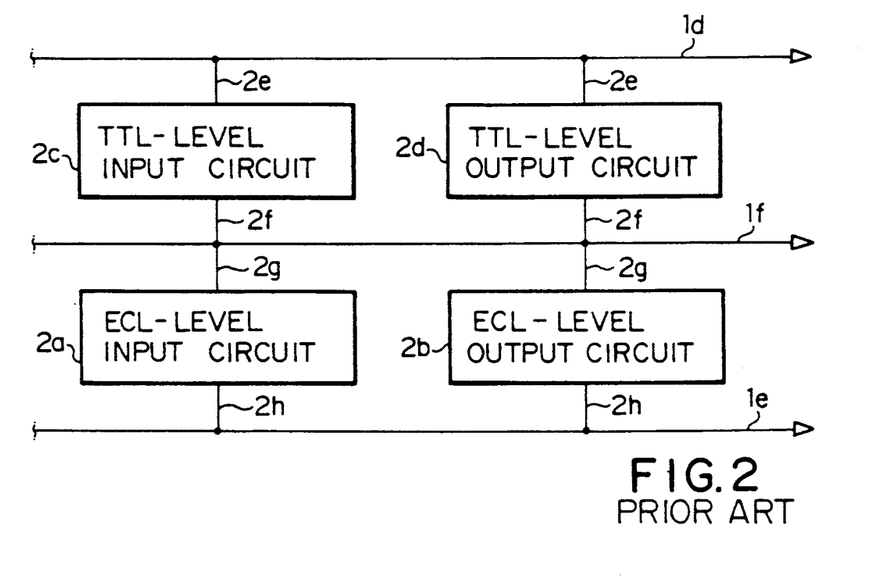
FIG. 2 is a block diagram showing the arrangement of TTL level interface circuits and ECL level interface circuits incorporated in a prior art semicustom-made semiconductor integrated circuit.

FIG. 1 shows a part of the semicustom-made semiconductor integrated circuit 1, and a central area 1a is provided for essential circuits. Interface circuit blocks 1b are located in the peripheral area 1c, and the ECL level interface circuits and the TTL level interface circuits are formed in the interface circuit blocks 1b, respectively. A positive voltage bus line 1d, a negative voltage bus line 1e and a ground voltage bus line 1f will extend over the interface circuit blocks 1b and be selectively coupled therewith in a later stage. ECL level interface circuits such as an ECL level input circuit 2a and an ECL level output circuit 2b as well as a TTL level input circuit 2c and a TTL level output circuit 2d are assumed to be formed in the interface level blocks 1b as shown in FIG. 2. The TTL level input circuit 2c and the TTL level output circuit 2d are coupled at the high voltage nodes thereof to the positive voltage bus line 1d through inter-level wirings 2e, respectively, and the low voltage nodes of the TTL level circuits 2c and 2d are coupled through inter-level wirings 2f to the ground voltage bus line 1f. However, the high voltage nodes of the ECL level input circuit 2a and the ECL level output circuit 2b are coupled through interlevel wirings 2g to the ground voltage bus line 1f, and the low voltage nodes thereof are coupled through inter-level wirings 2h to the negative voltage bus line 1e.

Figure 3:
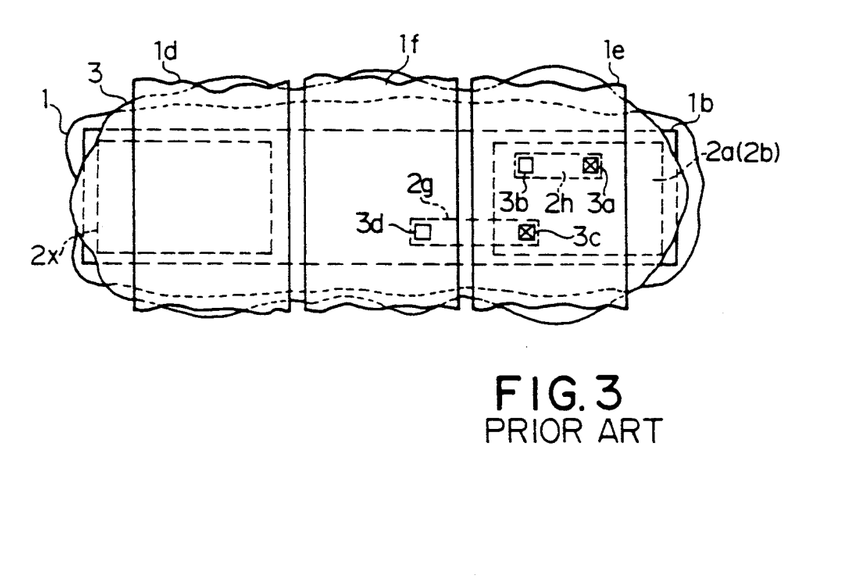
FIG. 3 is a plan view showing a part of the layout of the ECL level interface circuit shown in FIG. 2.

FIG. 3 illustrates the layout of the semicustom-made semiconductor integrated circuit shown in FIG. 2, but the TTL level circuits 2c and 2d are deleted from FIG. 3 for the sake of simplicity. The semiconductor chip 1 is covered with an inter-level insulating film structure 3, and the positive voltage bus line 1d, the negative voltage bus line 1e and the ground voltage bus line 1f extend in parallel on the inter-level insulating film structure 3. The inter-level wirings 2g and 2h are formed in the inter-level insulating film structure 3, and contact windows 3a, 3b, 3c and 3d are produced at appropriate areas in the inter-level insulating film structure 3, respectively. Although the contact windows 3a to 3d are not exposed, small squares drawn with real lines stand for the contact windows 3a to 3d, and mark "x" is provided in the small squares representative of contact windows interconnecting lower level cells and intermediate level wirings for better understanding. The inter-level wiring 2h is located between an ECL cell serving as the ECL level circuit 2a or 2b and the negative voltage bus line 1e, and the contact windows 3a and 3b allow the inter-level wiring 2h to interconnect the ECL level circuit 2a or 2b and the negative voltage bus line 1e. However, the contact window 3c is located over the ECL cell, and the contact window 3d is formed beneath the ground voltage bus line 1f. The inter-level wiring 2g extends between the contact windows 3c and 3d and interconnects the ECL level circuit 2a or 2b and the ground voltage bus line 1f. However, no inter-level wiring is provided for a TTL cell 2x incorporated in the same interface circuit block 1b. The arrangement and the layout shown in FIGS. 2 and 3 are of the dual power supply system, and the semicustom-made semiconductor integrated circuit operates with the dual power supply system and the ground voltage bus line 1f.

Figure 4:
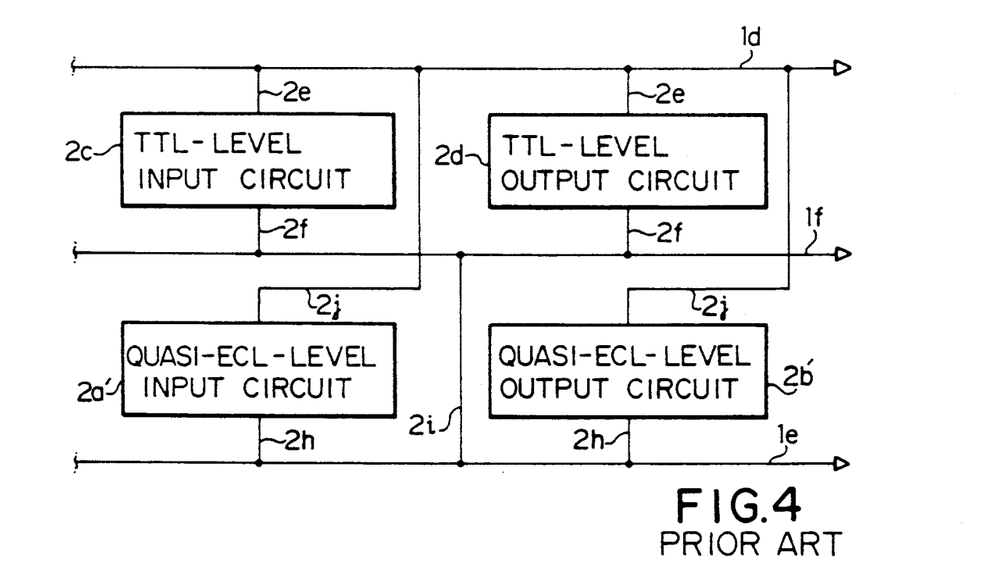
FIG. 4 is a block diagram showing the arrangement of TTL level interface circuits and quasi-ECL level interface circuits incorporated in another prior art semicustom-made semiconductor integrated circuit.
Figure 5:
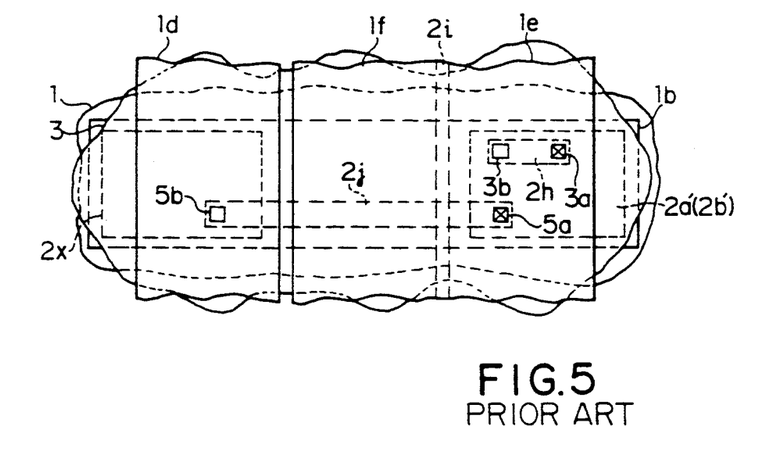
FIG. 5 is a plan view showing the layout of a part of the quasi-ECL level interface circuit shown in FIG. 4.

In order to fabricate the quasi-ECL level interface circuits, the circuit arrangement and the layout are changed as shown in FIGS. 4 and 5. The TTL level input circuit 2c and the TTL level output circuit 2d are similar in arrangement to those shown in FIG. 2, however, the ECL level input circuit 2a and the ECL level output circuit 2b are slightly changed. Namely, the negative voltage bus line 1e is coupled through an inter-level wiring 2i to the ground voltage bus line 1f, and the high level nodes of the ECL level circuits 2a' and 2b' are coupled to the positive voltage bus line 1d through inter-level wirings 2j, respectively. The layout around the quasi-ECL level circuit 2a' or 2b' are illustrated in FIG. 5, and the inter-level wiring 2j extends over that area beneath the ground voltage bus line 1f for providing a current path between the positive voltage bus line 1d and the ECL level circuit 2a' or 2b'. A contact window 5a is provided for interconnection between the ECL level circuit 2a' or 2b', and the interlevel wiring 2j is coupled through a contact window 5b to the positive voltage bus line 1d. The negative voltage bus line 1e and the ground voltage bus line 1f are coupled to each other through a conductive coupling strip 2i, and the conductive coupling strip 2i is merged into the bus lines 1e and 1f. The negative voltage bus line 1e is pulled up to the ground voltage level, and, for this reason, a single power supply system allows the semicustom-made semiconductor integrated circuit to operate. The single power supply system makes the semicustom-made semiconductor integrated circuit simple and is, therefore, convenient to some applications.

However, a problem is encountered in the prior art semicustom-made semiconductor integrated circuit in that the layout of the inter-level wirings are widely different between the ECL level interface circuits 2a and 2b and the quasi-ECL level interface circuits 2a° and 2b'. If an interface circuit behaves on the ECL level, the inter-level wiring 2g is patterned to provide a current path. However, the inter-level wiring 2g is replaced with the inter-level wiring 2j if a customer requests the quasi-ECL level interface circuits 2a' and 2b'. This deteriorates the design efficiency of the semicustom-made semiconductor integrated circuit, and a large amount of time and labor is consumed while manufacturing.

SUMMARY OF THE INVENTION

It is therefore an important object of the present invention to provide a semicustom-made semiconductor integrated circuit which is easily responsive to the request of customer, i.e. selection between the dual power supply system and the single power supply system.

To accomplish the object, the present invention proposes to provide two pairs of high and low level lines to first and second interface circuits, respectively, and to selectively couple the high and low level lines through coupling means.

In accordance with the present invention, there is provided a semicustom-made semiconductor integrated circuit fabricated on a single semiconductor chip, comprising: a) a first high level line; b) a first low level line; c) a first interface circuit coupled between the first high level line and the first low level line; d) a second high level line; e) a second low level line; f) a second interface circuit coupled between the second high level line and the second low level line; and g) coupling means for alternatively coupling the first low level line to the second high level line and the first high and low level lines with the second high and low level lines, respectively, wherein said first high and low level lines and said second high and low level lines are coupled to either dual or single power supply system, said dual power supply system producing two power voltage levels different from each other, said single power supply system producing a single power voltage level.

BRIEF DESCRIPTION OF THE DRAWINGS

The features and advantages of a semicustom-made semiconductor integrated circuit according to the present invention will be more clearly understood from the following description taken in conjunction with the accompanying drawings in which.

DESCRIPTION OF THE PREFERRED EMBODIMENTS

First Embodiment

Figure 6:
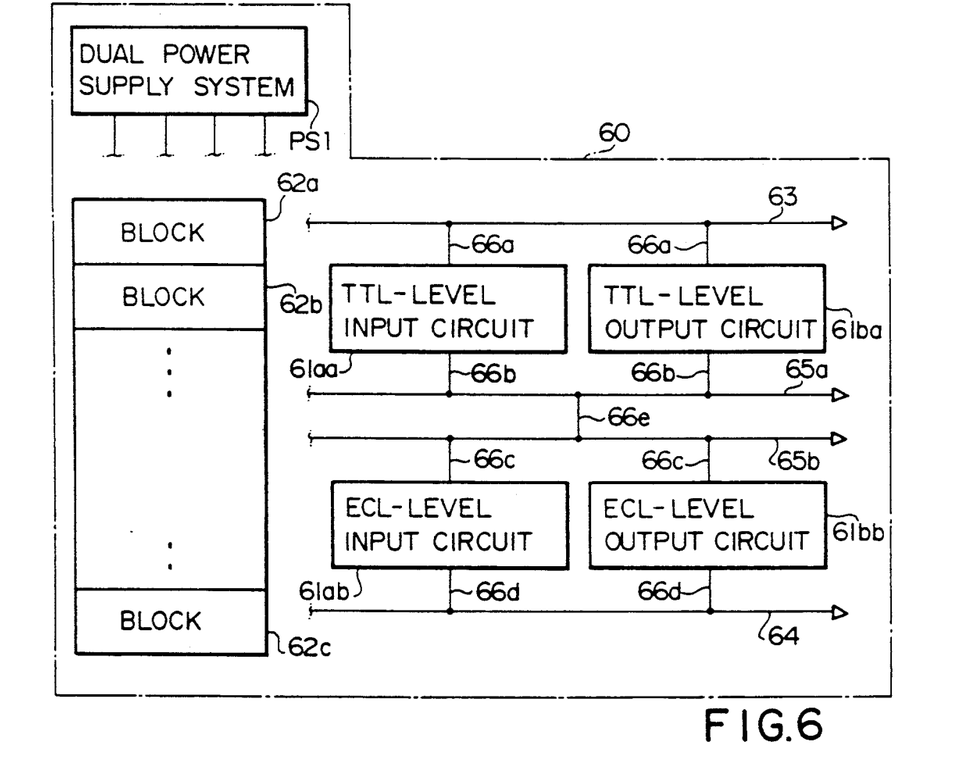
FIG. 6 is a block diagram showing the arrangement of a semicustom-made semiconductor integrated circuit equipped with ECL- level interface circuits according to the present invention.

Referring first to FIG. 6 of the drawings, a semicustom-made semiconductor integrated circuit is fabricated on a single semiconductor chip 60 and comprises a large number of component blocks including a plurality of interface circuit blocks 61aa, 61ab, 61ba and 61bb and other function blocks 62a, 62b, . . . , and 62c. Although only four interface circuit blocks 61aa to 61bb are shown in FIG. 6, more than four interface circuit blocks are incorporated in the semicustom-made semiconductor integrated circuit. In this instance, the interface circuit blocks 61aa and 61ab provide a TTL level input circuit and an ECL level input circuit, and a TTL level output circuit and an ECL level output circuit are implemented by the interface circuit blocks 61ba and 61bb, respectively. The TTL level input circuit and the TTL level output circuit are hereinbelow referred to as "TTL level interface circuit", and the ECL level input circuit and the ECL level output circuit are referred to as "ECL level interface circuit". A positive voltage bus line 63 and a negative voltage bus line 64 are provided in the semicustom-made semiconductor integrated circuit, and first and second ground voltage bus lines 65a and 65b are further provided for TTL level component circuits and ECL level component circuits, respectively. The positive voltage bus line 63 propagates a positive voltage level of about +5 volts, and the negative voltage bus line 64 ranges from −4.5 volts to −5.2 volts. The first and second ground voltage bus lines 65a an 65b propagate a ground voltage level, and, for this reason, the semicustom-made semiconductor integrated circuit shown in FIG. 6 needs a dual power supply system PS1 consisting of a positive voltage source and a negative voltage source. The TTL level component circuits include the TTL level input circuit 61aa and the TTL level output circuit 61ba, and the ECL level input circuit 61ab and the ECL level output circuit 61bb are the members of the ECL level component circuits. The TTL level input circuit 61aa and the TTL level output circuit 61ba are coupled at the high level nodes to the positive voltage bus line 63 through interlevel wirings 66a, respectively, and the low level nodes thereof are connected through inter-level wirings 66b to the first ground voltage bus line 65a. On the other hand, inter-level wirings 66c interconnect the second ground bus line 65b and the high level nodes of the input and output circuits 61ab and 61bb, respectively, and the low level nodes thereof are coupled through the inter-level wirings 66d to the negative voltage bus line 64. The semicustom-made semiconductor integrated circuit shown in FIG. 6 allows the TTL level component circuits and the ECL level component circuits to behave in the respective voltage ranges, and a wiring 66e interconnects the first and second ground voltage bus lines 65a and 65b, thereby supplying the ground voltage level to both of the first and second ground voltage bus lines 65a and 65b.

Figure 7:
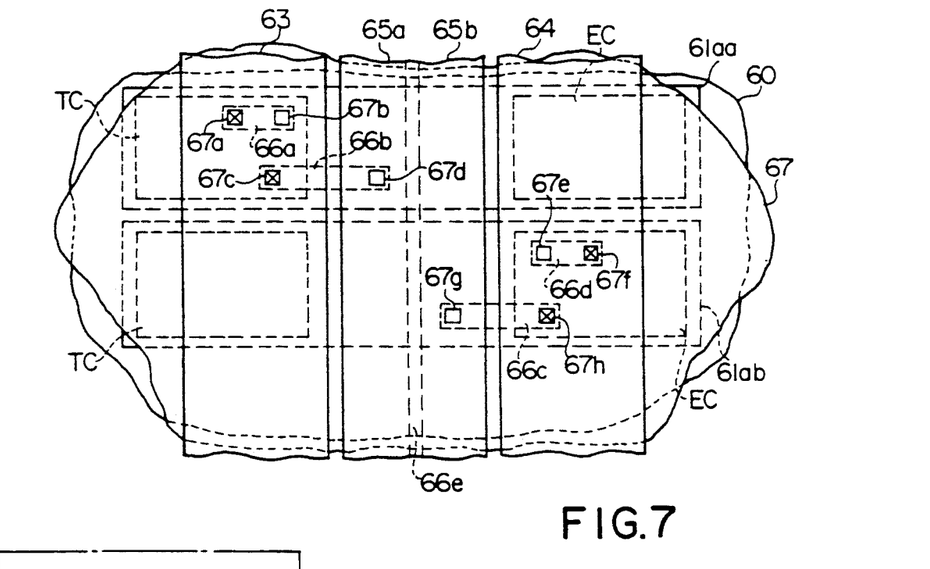
FIG. 7 is a plan view showing a part of the semicustom-made semiconductor integrated circuit shown in FIG. 6.

The layout of the inter-level wirings 66a to 66e is illustrated in FIG. 7. The semiconductor chip 60 is covered with an inter-level insulating film structure 67, and the voltage bus lines 63, 64, 65a and 65b extend on the inter-level insulating film structure 67. The TTL level input circuit 61aa is implemented by the TTL cell TC without any ECL cell, and the ECL level input circuit 61ab is implemented by the ECL cell EC only. The inter-level wirings 66a to 66e are provided in the inter-level insulating film structure 67. The inter-level wiring 66a interconnects the TTL cell TC of the TTL level interface circuit block of the TTL level input circuit 61aa and the positive voltage bus line 63 through contact windows 67a and 67b, and contact windows 67c and 67d allows the inter-level wiring 66b to interconnect the TTL cell TC of the TTL level input circuit 66aa and the first ground voltage bus line 65a. The inter-level wiring 66d is coupled through contact windows 67e and 67f to the negative voltage bus line 64 and the ECL cell EC of the ECL level input circuit 66ab, and contact windows 67g and 67h allow the inter-level wiring 66c to be held in contact with the ECL cell EC and the second ground voltage bus line 65b. The wiring 66e is implemented by a conductive coupling strip where the first and second ground voltage bus lines 65a and 65b are merged.

Figure 8:
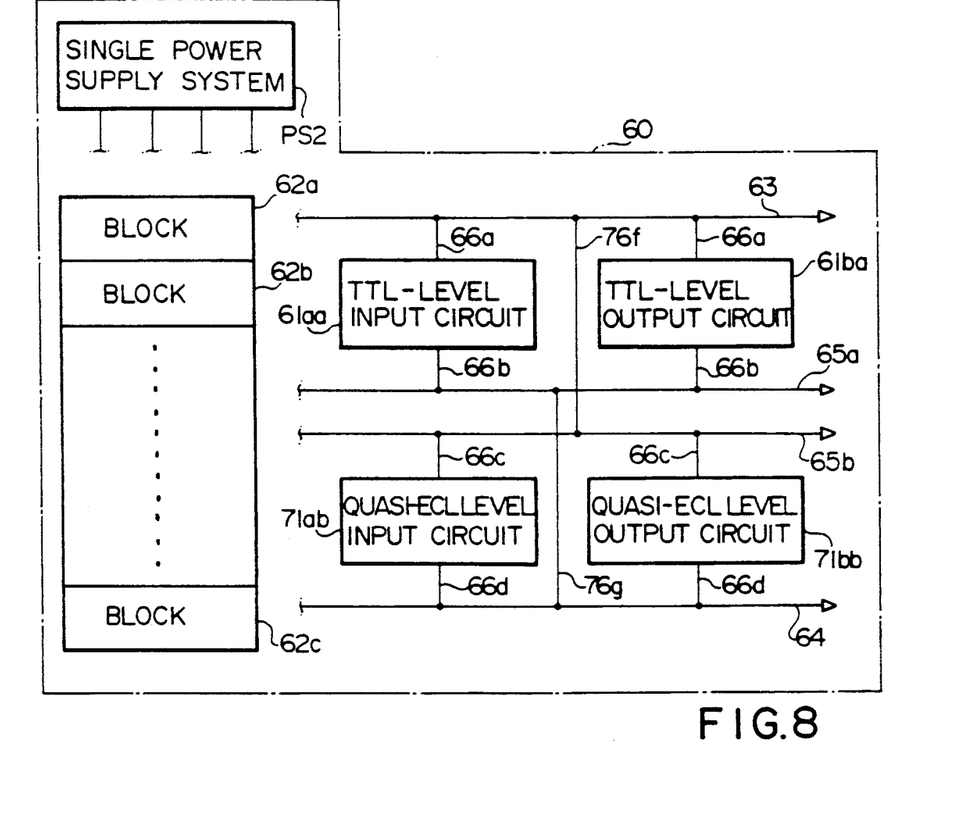
FIG. 8 is a block diagram showing another arrangement of the semicustom-made semiconductor integrated circuit equipped with quasi-ECL level interface circuits according to the present invention.

When a customer requests the manufacturer to fabricate a quasi-ECL level input circuit 71ab and a quasi-ECL level output circuit 71bb instead of the ECL level interface circuits 61ab and 61bb, inter-level wirings 76f and 76g are provided for the first and second ground voltage bus lines 65a and 65b, and the wiring 66e is removed from between the first and second ground bus lines 65a and 65b as shown in FIG. 8. The inter-level wiring 76f interconnects the positive voltage bus line 63 and the second ground bus line 65b, and the inter-level wiring 76g is coupled between the negative voltage bus line 64 and the first ground voltage bus line 65b. The semicustom-made semiconductor integrated circuit thus arranged needs a single voltage supply system PS2 producing the positive voltage level only, because the second ground voltage bus line 65b and the negative voltage bus line 64 propagate the positive voltage level and the ground voltage level, respectively.

Figure 9:
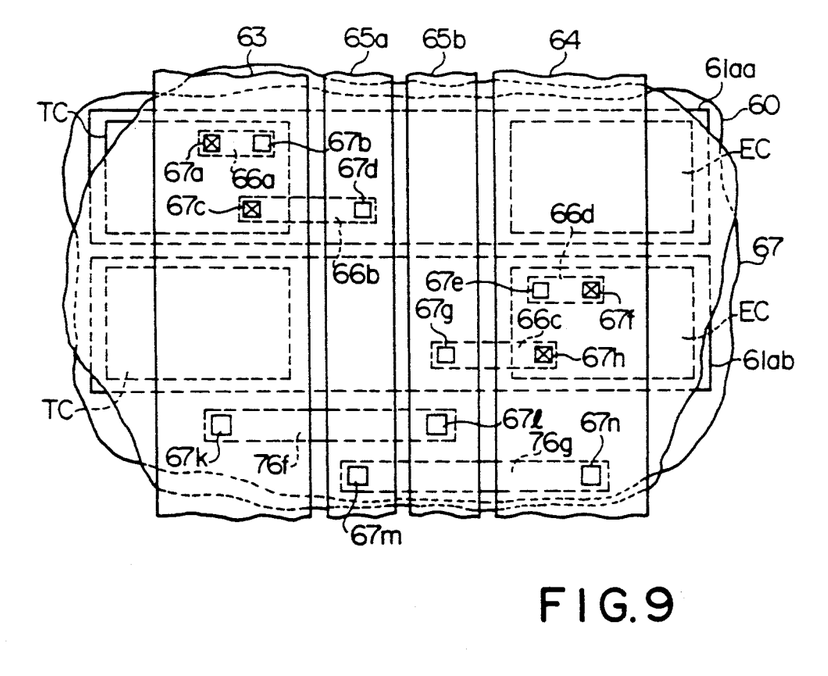
FIG. 9 is a plan view showing a part of the semicustom-made semiconductor integrated circuit shown in FIG. 8.

The layout of the inter-level wirings 66a to 66d, 76f and 76g are illustrated in FIG. 9. The inter-level wiring 76f is held in contact with the positive voltage bus line 63 and the second ground voltage bus line 65b through contact windows 67k and 67l formed in the inter-level insulating film structure 67. Contact windows 67m and 67n are further formed in the inter-level insulating film structure 67 and allows the inter-level wiring 76g to interconnect the negative voltage bus line 64 and the first ground voltage bus line 65a.

Comparing FIG. 9 with FIG. 7, it will be understood that the locations of the inter-level wirings 66a to 66d provided in association with the ECL level input circuit 61ab and the TTL level input circuit 61aa are identical with those illustrated in FIG. 9. Only the wirings for the first and second ground bus lines 65a and 65b are modified, and, for this reason, the manufacturer slightly modifies the layout of the inter-level wirings so as to cope with the request of a customer regarding the semicustom-made semiconductor integrated circuits shown in FIGS. 6 and 8. The inter-level wirings 66e, or 76f and 76g, are usually disposed at a corner of the semiconductor chip 60 where no function block is located, and such a small modification decreases the amount of time and labor consumed in the design work for a semicustom-made semiconductor integrated circuit.

In the first embodiment, the positive voltage bus line 63 and the first ground voltage bus line 65a serve as first high and low level lines, respectively, and second high and low level lines are implemented by the second ground voltage bus line 65b and the negative voltage bus line 64, respectively. The wiring 66e and the inter-level wirings 76f and 76g as a whole constitute coupling means.

Second Embodiment

Figure 10:
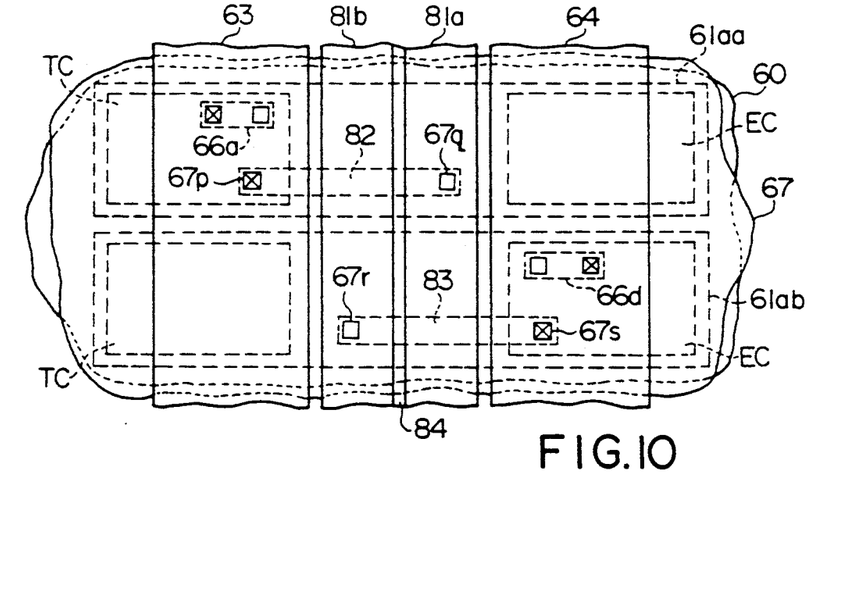
FIG. 10 is a plan view showing the arrangement of a part of another semicustom-made semiconductor integrated circuit equipped with ECL level interface circuits in accordance with the present invention.

Turning to FIG. 10 of the drawings, another semicustom-made semiconductor integrated circuit is illustrated. The semicustom-made semiconductor integrated circuit illustrated in FIG. 10 is similar in arrangement to that shown in FIG. 7 with the exception of the layout of bus lines and the interconnections related thereto, and, for this reason, the component circuits, the other inter-level wirings and the inter-level insulating film structure are designated by the same reference numerals used in FIG. 7. In this instance, first and second ground voltage bus lines 81a and 81b are changed in location with respect to the first and second ground voltage bus lines 65a and 65b. Namely, the first ground voltage bus line 81a serves as a first low level line and is located in the vicinity of the negative voltage bus line 64, which serves as a second low level line. On the other hand, the second ground voltage bus line 81b provides a second high level line intervening between the first ground voltage bus line 81a and the positive voltage bus line 63 which serves as a first high level line. Thus, the first and second ground voltage bus lines 81a and 81b are alternated in location with one another, and, for this reason, inter-level wirings 82 and 83 are slightly elongated. Namely, the inter-level wiring 82 in the inter-level insulating film structure 67 extends over the second ground voltage bus line 81b and is held in contact with the TTL cell TC of the TTL level input circuit 61aa and the first ground voltage bus line 81a through contact windows 67p and 67q. On the other hand, the inter-level wiring 83 runs across the first ground voltage bus line 81a and interconnects the ECL cell EC of the ECL level input circuit 61ab and the second ground voltage bus line 81b. The first and second ground voltage bus lines 81a and 81b are merged into a conductive coupling strip 84 corresponding to the wiring 66e. The semicustom-made semiconductor integrated circuit thus arranged is equipped with a dual power supply system which supplies the positive voltage level and the negative voltage level to the positive voltage bus line 63 and the negative voltage bus line 64, respectively.

Figure 11:
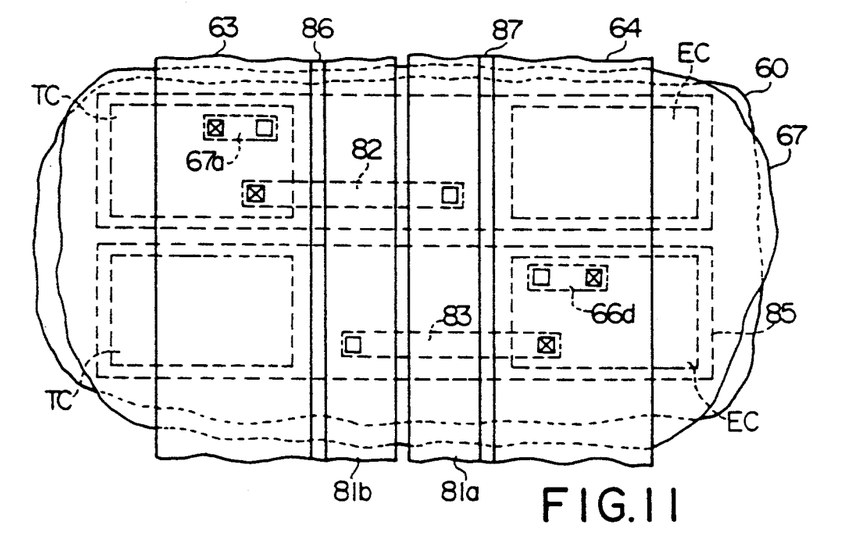
FIG. 11 is a plan view showing another arrangement of the part of the semicustom-made semiconductor integrated circuit equipped with quasi-ECL level interface circuits in accordance with the present invention.

If a customer requests quasi-ECL level input circuit 85 instead of the ECL level input circuit 61ab, the conductive coupling strip 84 is removed, and conductive coupling strips 86 and 87 are formed between the positive voltage bus line 63 and the second ground voltage bus line 81b and between the first ground voltage bus line 81a and the negative voltage bus line 64, respectively. The second ground voltage bus line 81b propagates the positive voltage level, and the negative voltage bus line 64 goes up to the ground voltage level. No negative voltage source is necessary, and the semicustom-made semiconductor integrated circuit thus arranged operates with a single power supply system.

As will be understood from FIGS. 10 and 11, even though the ECL level input circuit 61ab is replaced with the quasi-ECL level input circuit 85, no change takes place in the layout of the inter-level wirings 66a, 66d, 82 and 83. Only the conductive coupling strip 84 is changed to the conductive coupling strips 86 and 87. In this instance, the conductive coupling strips 84, 86 and 87 as a whole constitute coupling means. Since the coupling means is coplanar with said bus lines 63, 64, 81a and 81b, no real estate is consumed by the coupling means, and, therefore, the chip size is smaller than that of the first embodiment.

Third Embodiment

Figure 12:
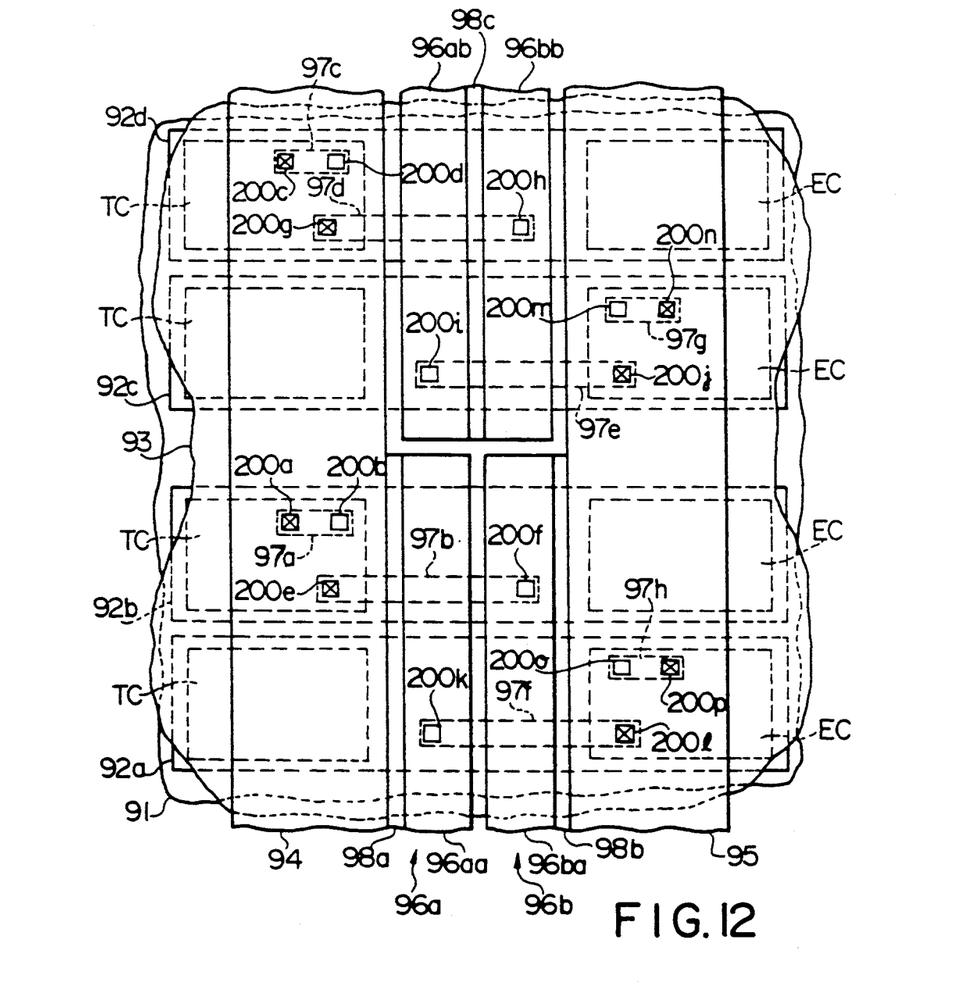
FIG. 12 is a plan view showing the arrangement of still another semicustom-made semiconductor integrated circuit according to the present invention.

Turning to FIG. 12 of the drawings, still another semicustom-made semiconductor integrated circuit embodying the present invention is fabricated on a semiconductor chip 91, and interface circuit blocks 92a, 92b, 92c and 92d together with other function blocks (not shown). The interface circuit blocks 92b and 92d respectively provide TTL level interface circuits, and a quasi-ECl level interface circuit and an ECL level interface circuit are formed in the interface circuit blocks 92c and 92a, respectively. Thus, the ECL level interface circuit and the quasi-ECL level interface circuit are mixed on the single semiconductor chip 91. The semiconductor chip 91 is covered with an inter-level insulating film structure 93, and a positive voltage bus line 94 and a negative voltage bus line 95 extend on the inter-level insulating film structure 93. Between the positive voltage bus line 94 and the negative voltage bus line 95 are further provided a first and second ground voltage bus lines 96a and 96b each separated into more than two sections 96aa and 96ab or 96ba and 96bb. The TTL level interface circuits fabricated in the interface circuit blocks 92b and 92d are coupled to the positive voltage bus line 94 and the first and second sections 96ba and 96bb of the second ground voltage bus line 96b through inter-level wirings 97a, 97b, 97c and 97d. Namely, the inter-level wiring 97a passes through contact windows so as to interconnect the interface circuit block 97b and the positive voltage bus line 94. Similarly, the inter-level wiring 97c interconnects the interface circuit block 97d and the positive voltage bus line 94 through contact windows 200c and 200d. The inter-level wiring 97b interconnects the interface circuit block 92b and the first section 96ba of the second ground voltage bus line 96b through contact windows 200e and 200f, and the inter-level wiring 97d passes through contact windows 200g and 200h so as to interconnect the interface circuit block 92d and the second section 96bb of the second ground voltage bus line 96b.

On the other hand, the ECL level interface circuits fabricated in the interface circuit blocks 92c and 92a are coupled to the first and second sections 96aa and 96ab of the first ground voltage bus line 96a through inter-level wirings 97e and 97f and the negative voltage bus line 95 through inter-level wirings 97g and 97h. Contact windows 200i and 200j are provided for the inter-level wiring 97e, and the inter-level wiring 97f are coupled to the first section 96aa of the first ground voltage bus line 96a through contact windows 200k and 200l. For the interconnection between the interface circuit block 92c and the negative voltage bus line 95, contact windows 200m and 200n are formed in the inter-level insulating film structure 93, and the inter-level wiring 97h interconnects the interface circuit block 92a and the negative voltage bus line 95 through contact windows 200o and 200p.

Since the interface circuit block 92a provides the quasi-ECL level interface circuit, conductive coupling strips 98a and 98b interconnect the first section 96aa and the positive voltage bus line 94, and the first section 96ba and the negative voltage bus line 95, respectively, as similar to those shown in FIG. 11. However, the second section 96ab is coupled with the second section 96bb by means of a conductive coupling strip 98c as similar to that shown in FIG. 10, because the ECL level interface circuit is fabricated in the interface circuit block 92c. The separation of the first and second ground voltage bus lines 96a and 96b into the plurality of sections 96aa, 96ab, 96ba and 93bb allows the ECL level interface circuit and the quasi-ECL level interface circuit to be fabricated on the single semiconductor chip 91. If other sections of the first and second ground voltage bus lines 96a and 96b are coupled with each other, component function blocks benefit from the combined ground voltage line because of a low resistance.

As will be understood from the foregoing description, the semicustom-made semiconductor integrated circuit according to the present invention makes the layout of the inter-level wirings simple. This is because of the fact that the interconnections between the bus lines change the voltage range of the interface circuit.

Although particular embodiments of the present invention have been shown and described, it will be obvious to those skilled in the art that various changes and modifications may be made without departing from the spirit and scope of the present invention.

What is claimed is:

1. A semicustom-made semiconductor integrated circuit fabricated on a single semiconductor chip, comprising:
 a) a first high level voltage line;
 b) a first low level voltage line;
 c) a first interface circuit coupled between said first high level voltage lie and said first low level voltage line;
 d) a second high level voltage line;
 e) a second low level voltage line, said first high and low level voltage lines and said second high and low level voltage lines extending substantially parallel and adjacent to one another;

f) a second interface circuit coupled between said second high level voltage line and said second low level voltage line; and g) coupling means for alternatively coupling said first low level voltage line with said second high level voltage line and said first high and low level voltage lines with said second high and low level voltage lines, respectively, wherein said first high and low level voltage lines and said second high and low level voltage lines are coupled between either dual or single power supply system and said first and second interface circuits whereby coupling arrangements between said first and second high and low level voltage lines and said first interface circuit and between said second high and low level voltage lines and said second interface circuit in said dual power supply system being similar to coupling arrangements between said first high and low level voltage lines and said first interface circuit and between said second high and low level voltage lines and said second interface circuit in said single power supply system, said dual power supply system producing two power voltage levels different from each other, said single power supply system producing a single power voltage level.

2. A semicustom-made semiconductor integrated circuit as set forth in claim 1, in which said first interface circuit is at least one of a transistor-transistor logic circuit and a complementary metal oxide semiconductor inverter, and in which said second interface circuit is an emitter-coupled logic circuit.

3. A semicustom-made semiconductor integrated circuit as set forth in claim 2, in which said semicustom-made semiconductor integrated circuit has a multiple level structure having at least one lower level, an intermediate level and an upper level, and in which said first high and low level voltage lines on said upper level and said second high and low level voltage lines on said upper level are respectively coupled to said first and second interface circuits on said lower level through respective inter-level wirings extending on said intermediate level, wherein said coupling means are located on said upper level and held in contact with said first low level voltage line and said second high level voltage line.

4. A semicustom-made semiconductor integrated circuit as set forth in claim 2, in which said first and second high level voltage lines propagate a positive voltage level and a ground voltage level, respectively, and in which said first and second low level voltage lines propagate said ground voltage level and a negative voltage level, respectively.

5. A semicustom-made semiconductor integrated circuit as set forth in claim 4, in which said first low level voltage line is located adjacent to said first high level voltage line, and in which said second high level voltage line is located between said first low level voltage line and said second low level voltage line.

6. A semicustom-made semiconductor integrated circuit as set forth in claim 5, in which said coupling means is implemented by a conductive strip merging said first low level voltage line and said second high level voltage line.

7. A semicustom-made semiconductor integrated circuit as set forth in claim 4, in which said second high level voltage line is adjacent to said first high level voltage line, and in which said first low level voltage line is located between said second high level voltage line and said second low level voltage line.

8. A semicustom-made semiconductor integrated circuit as set forth in claim 7, in which said coupling means is implemented by a conductive strip merging said first low level voltage line and said second high level voltage line.

9. A semicustom-made semiconductor integrated circuit as set forth in claim 2, in which said semicustom-made semiconductor integrated circuit has a multiple level structure having at least a lower level, an intermediate level and an upper level, and in which said first high and low level voltage lines on said upper level and said second high and low level voltage lines on said upper level are respectively coupled to said first and second interface circuits on said lower level through respective inter-level wirings extending on said intermediate level, wherein said coupling means are located on said intermediate level for coupling said first high level voltage line with said second high level voltage line and for coupling said first low level voltage line with said second low level voltage line.

10. A semicustom-made semiconductor integrated circuit as set forth in claim 9, in which said first and second high level voltage lines propagate a positive voltage level, and in which said first and second low level voltage lines propagate a ground voltage level.

11. A semicustom-made semiconductor integrated circuit as set forth in claim 10, in which said coupling means are implemented by interlevel wirings for coupling said first high level voltage line with said second high level voltage line and for coupling said first low level voltage line with said second low level voltage line.

12. A semicustom-made semiconductor integrated circuit as set forth in claim 10, in which said first high level voltage line is adjacent to said second high level voltage line, and in which said first low level voltage line is located between said second high level voltage line and said second low level voltage line.

13. A semicustom-made semiconductor integrated circuit as set forth in claim 12, in which said coupling means are implemented by two conductive strips one of which is merged into said first and second high level voltage lines and the other of which is merged into said first and second low level voltage lines.

14. A semicustom-made semiconductor integrated circuit as set forth in claim 12, in which said first low level voltage line is separated into a plurality of sections, and in which said second high level voltage line is separated into a plurality of sections respectively paired with the sections of said first low level voltage line so as to form a plurality of section pairs.

15. A semicustom-made semiconductor integrated circuit as set forth in claim 14, in which sections of one of said section pairs are respectively coupled to said first high level voltage line and said second low level voltage line through conductive strips, and in which sections of another section pair are coupled with each other through a conductive strip.

* * * * *